(12) United States Patent
Moidu (10) Patent No.: US 8,531,752 B2
(45) Date of Patent: Sep. 10, 2013

(54) PIVOTABLE MEMS DEVICE (75) Inventor: Abdul Jaleel K. Moidu, Nepean (CA)

(73) Assignee: JDS Uniphase Corporation, Milpitas, CA (US)

( * ) Notice: Subject to any disclaimer, the term of this patent is extended or adjusted under 35 U.S.C. 154(b) by 134 days.

(21) Appl. No.: 13/281,475

(22) Filed: Oct. 26, 2011

(65) Prior Publication Data

US 2012/0281266 A1     Nov. 8, 2012

Related U.S. Application Data

(63) Continuation-in-part of application No. 12/652,073, filed on Jan. 5, 2010, now Pat. No. 8,274,722, which is a continuation-in-part of application No. 12/353,475, filed on Jan. 14, 2009, now Pat. No. 7,952,778.

(60) Provisional application No. 61/021,083, filed on Jan. 15, 2008, provisional application No. 61/406,716, filed on Oct. 26, 2010.

(51) Int. Cl.
    *G02B 26/08*    (2006.01)
(52) U.S. Cl.
    USPC ........................................ 359/225.1
(58) Field of Classification Search
    USPC ............... 359/198.1, 223.1–226.1, 290, 291, 359/871, 872
    See application file for complete search history.

(56) References Cited

U.S. PATENT DOCUMENTS

| | | | |
|---|---|---|---|
| 6,275,320 B1 | 8/2001 | Dhuler et al. | 359/237 |
| 6,529,310 B1 | 3/2003 | Huibers et al. | 359/291 |
| 6,583,921 B2 | 6/2003 | Nelson | 359/291 |
| 6,608,712 B2 | 8/2003 | Michalicek | 359/224.1 |
| 6,906,848 B2 | 6/2005 | Aubuchon | 359/291 |
| 6,914,711 B2 | 7/2005 | Novotny et al. | 359/291 |
| 6,960,305 B2 | 11/2005 | Doan et al. | 216/2 |
| 6,992,810 B2 | 1/2006 | Pan et al. | 359/290 |
| 6,999,215 B2 | 2/2006 | Dewa et al. | 359/198.1 |
| 7,010,188 B2 | 3/2006 | Miller et al. | 385/18 |
| 7,043,910 B2 | 5/2006 | Hickey | 60/527 |
| 7,075,699 B2 | 7/2006 | Oldham et al. | 359/290 |
| 7,126,250 B2 | 10/2006 | Greywall et al. | 310/309 |
| 7,142,352 B2 | 11/2006 | Pardo et al. | 359/298 |
| 7,265,887 B2 | 9/2007 | Orcutt | 359/224.1 |
| 7,355,317 B2 | 4/2008 | Greywall | 310/309 |
| 7,411,713 B2 | 8/2008 | DiCarlo | 359/224.1 |
| 7,424,181 B2 | 9/2008 | Haus et al. | 385/16 |
| 7,432,629 B2 | 10/2008 | Mala et al. | 310/309 |
| 7,567,375 B2 | 7/2009 | Enoksson et al. | 359/291 |

(Continued)

FOREIGN PATENT DOCUMENTS

| | | |
|---|---|---|
| EP | 1643290 | 4/2006 |
| EP | 2008964 | 12/2008 |
| JP | 2004082288 | 3/2004 |

*Primary Examiner* — Euncha Cherry (74) *Attorney, Agent, or Firm* — Teitelbaum & MacLean; Neil Teitelbaum; Doug MacLean (57) ABSTRACT

A tiltable MEMS device is disclosed having an asymmetric, electrostatically actuated tiltable platform and a reflector mounted on the platform so that the platform is hidden below the reflector, except for a portion of long side of the platform extending from under the reflector. An electrostatic stator actuator is mounted on the substrate under the long side of the tiltable platform. The range of a unidirectional tilt is increased by providing a recess in the substrate under the extended portion of the platform to accommodate the increased range of movement of the tiltable platform.

20 Claims, 11 Drawing Sheets

(56) References Cited

U.S. PATENT DOCUMENTS

| | | | |
|---|---|---|---|
| 7,616,372 B2 | 11/2009 | Miller et al. | 359/291 |
| 7,629,725 B1 | 12/2009 | Knollenberg et al. | 310/309 |
| 7,643,195 B2 | 1/2010 | Ishii et al. | 359/224.1 |
| 7,715,076 B2 | 5/2010 | Moidu | 359/199.2 |
| 7,746,538 B2 | 6/2010 | Ishii | 359/290 |
| 7,817,331 B2 | 10/2010 | Moidu | 359/291 |
| 7,952,778 B2 | 5/2011 | Moidu et al. | 359/198.1 |
| 2003/0039021 A1* | 2/2003 | Ton | 359/290 |
| 2003/0123126 A1 | 7/2003 | Meyer et al. | 359/291 |
| 2009/0268270 A1 | 10/2009 | Keyworth et al. | 359/226.1 |
| 2010/0103494 A1 | 4/2010 | Moidu | 359/225.1 |

\* cited by examiner

PIVOTABLE MEMS DEVICE

CROSS-REFERENCE TO RELATED APPLICATIONS

The present application is a continuation in part of U.S. patent application Ser. No. 12/652,073 filed Jan. 5, 2010 now U.S. Pat. No. 8,274,722 which is a continuation in part of U.S. patent application Ser. No. 12/353,475, filed Jan. 14, 2009, now U.S. Pat. No. 7,952,778 which claims priority from U.S. Patent Application No. 61/021,083, filed Jan. 15, 2008, which are incorporated herein by reference for all purposes. The present application claims priority from U.S. Patent Application No. 61/406,716 filed Oct. 26, 2010, which is incorporated herein by reference for all purposes.

TECHNICAL FIELD

The present invention relates to micro-electro-mechanical (MEMS) devices, and in particular to MEMS devices including pivotable reflectors for light beam steering applications.

BACKGROUND OF THE INVENTION

A micro-electromechanical system (MEMS) is a micro-sized electro-mechanical structure manufactured by using microfabrication processes mostly derived from integrated circuit fabrication processes. The developments in the field of MEMS process engineering enabled batch production of electrostatically tiltable MEMS micromirrors and micromirror arrays that can be used in visual displays, optical attenuators and switches, and other devices. Using MEMS devices in fiberoptic switches attracts a particular interest. Light emitted by optical fibers can be focused on micromirrors to reliably switch optical signals between different optical fibers or waveguides.

A significant problem of using MEMS micromirror devices is related to presence of unwanted reflections of light from a fraction of MEMS substrate not covered by micromirrors, such as inter-mirror gaps and mirror hinge structures. While the inter-mirror gaps must be present for the MEMS mirrors to function independently on each other, mirror hinge structures can be hidden by placing MEMS mirrors over the hinges. These "hidden hinge" MEMS micromirror devices are particularly beneficial for operation in wavelength selective optical switches, in which MEMS micromirror arrays are placed in a wavelength-dispersed optical plane. Hiding mirror hinges from impinging optical beams results in efficient stray light suppression.

Hidden-hinge MEMS devices are known. Pan et al. in U.S. Pat. No. 6,992,810 describe a MEMS device having an electrostatic actuator, wherein the actuator's rotor has two pedestals for attaching a rectangular mirror over the actuator, so that the actuating mechanism is completely covered. Nelson in U.S. Pat. No. 6,583,921 describes a hidden-hinge MEMS device having a suspended tiltable platform for non-contacting edge-coupled operation to prevent mirror sticking at an extreme angle of tilt.

Detrimentally, prior-art hidden-hinge MEMS devices have a relatively weak electrostatic actuation force and/or a relatively narrow tilting range. Since electrostatic actuators are accommodated under the tiltable micromirror itself, they are smaller than the micromirror, which limits the achievable torque. Furthermore, at least for fiberoptic switching applications, the MEMS micromirrors have to remain relatively thick to ensure good optical quality (flatness) of the mirror surface. Thicker MEMS micromirrors have higher mass and moment of inertia, which reduces the switching speed. To support a thicker mirror, the torsional hinges have to be thickened as well. The thickened torsional hinges require more powerful electrostatic actuation. However, the electrostatic actuators have to be accommodated under the mirror, within the perimeter of the latter, and thus are limited in length and width. This imposes a limit to which one can increase the actuation force. One can increase the electrostatic force by increasing driving voltage; however, electronic drivers have a limit to which a driving voltage can be increased.

A need exists to construct a hidden-hinge MEMS device that would combine a high switching speed, a good optical quality of the MEMS mirror, and a high electrostatic torque with a relatively large achievable tilt angle of the mirror, without the need to increase a driving voltage of the MEMS device. Accordingly, it is a goal of the present invention to provide such a MEMS device.

SUMMARY OF THE INVENTION

In a MEMS device of the invention, an electrostatic actuator platform is lengthened to extend from under the MEMS mirror, thus increasing the electrostatic torque. Preferably, a covering structure is mounted on the substrate proximate to the extended portion of the tiltable platform to shield it from external light. The platform is extended to one side of the MEMS mirror and is tilted only in one direction. A recess may be provided in the substrate under the extended portion of the platform. The depth of the recess can be made sufficient to provide a required range of the unidirectional tilt at the increased electrostatic torque due to the extended platform. Advantageously, the unidirectional tilt simplifies MEMS driving electronics, because only one MEMS electrode needs to be energized over the entire tilting range. To maintain stability of the structure with respect to shock and vibration, the platform is mass balanced, that is, the center of gravity of the whole asymmetric pivoting structure is placed directly above, or preferably on the axis of tilt.

In accordance with the invention, there is provided a micro-electro-mechanical device comprising:

a substrate;

a pivoting structure comprising:

a tiltable platform disposed over the substrate, pivotable about a first axis substantially parallel to the substrate, wherein the tiltable platform is asymmetric about the first axis, having a long side extending in a first direction perpendicular to the first axis and a short side extending a shorter distance than the long side in a second, opposite direction;

a pedestal extending upwardly from the tiltable platform; and a reflector mounted on the pedestal, the reflector extending over the short side and a first portion of the long side of the tiltable platform, wherein a second portion of the long side of the tiltable platform extends from under the reflector;

wherein the pivoting structure has a center of gravity on or directly above the first axis;

a first support for supporting the tiltable platform over the substrate;

a first hinge structure defining the first axis, extending between the first support and the tiltable platform; and a first electrode structure including a first electrode mounted on the substrate under the long side of the tiltable platform, for tilting the pivoting structure about the first axis.

In one embodiment, the first hinge structure comprises a pair of torsional hinges extending from opposite sides of the tiltable platform, and the first support comprises a pair of posts extending from the substrate on the opposite sides of the tiltable platform and receiving the ends of the torsional hinges. Preferably, the micro-electro-mechanical device includes a covering structure mounted on the substrate proximate to the long side of the tiltable platform, the covering structure having an overhang section disposed over the second portion of the long side of the tiltable platform, to shield the long side of the tiltable platform from impinging light.

In another embodiment of the invention, the first hinge structure comprises first torsional hinges extending from opposite sides of the tiltable platform, wherein the support comprises a gimbal for pivoting about a second axis perpendicular to the first axis, surrounding the tiltable platform and receiving the ends of the first torsional hinges, the micro-electro-mechanical device further comprising:

second torsional hinges defining the second axis, extending from opposite sides of the gimbal; a pair of second supports on the substrate on the opposite sides of the gimbal and receiving the ends of the second torsional hinges; and a second electrode mounted on the substrate, for pivoting the gimbal, the tiltable platform, and the reflector about the second axis.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. In FIGS. 2A, 2B to 6, 8A, 8B, and 9A to 9D, similar numerals denote similar elements.

Figure 1A:
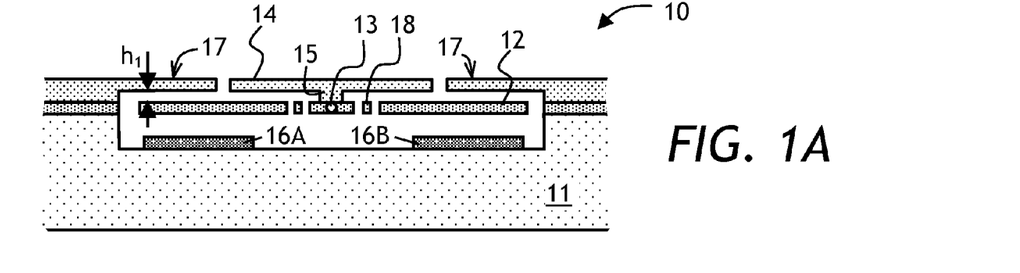
FIGS. 1A and 1B are side cross-sectional views of a symmetric hidden-hinge MEMS device in accordance with copending U.S. patent application Ser. No. 12/652,073.
Figure 1B:
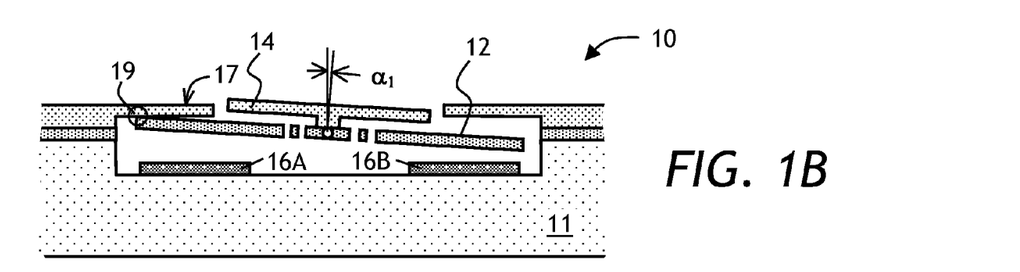

Referring to FIGS. 1A and 1B, a hidden-hinge MEMS device 10, disclosed in copending U.S. patent application Ser. No. 12/652,073, includes a substrate 11 and a pivoting structure tiltable about an axis 13 and suspended above the substrate 11 by a torsional hinge 18. The pivoting structure includes a symmetrical platform 12 and a mirror 14 fixed to the platform 12 by a pedestal 15. Electrodes 16A, 16B are disposed on the substrate 11 beneath the outer free ends of the platform 12 for tilting the platform 12 about the axis 13 in two directions. Overhang sections 17, extending from an upper surface of the substrate 11 above the outer free ends of the platform 12, shield the platform 12 from light to reduce light scattering, while allowing the platform 12 to be longer than the mirror 14. The mirror 14 is has a flat mirrored upper surface. The increased length of the platform 12 results in an increased electrostatic torque due to a leverage effect.

In operation, voltage is applied to the stator electrode 16A or 16B, while the platform 12 is kept at a ground potential. This causes the platform 12 to attract to the electrode 16A or 16B, tilting left or right, respectively. In FIG. 1B, the platform 12 is tilted towards the right electrode 16B. The range of tilt is limited by a distance $h_1$ between the platform 12 and a bottom surface of the overhang section 17 when no voltage is applied. When the platform 12 and the mirror 14 tilt by an angle $\alpha_1$, the platform 12 can touch the overhang section 17 at a point 19, which can cause the platform to "stick" to the overhang section 17. Therefore, in the hidden-hinge MEMS device 10, a tilt range of the mirror 14 is limited by the distance $h_1$. It is difficult to increase the distance $h_1$ because a mirror layer, in which the mirror 14 and the overhang section 17 are formed, must stay relatively thin and flat. Complete removal of overhang sections is detrimental for stray light management and manufacturing yield related reasons.

Figure 2A:
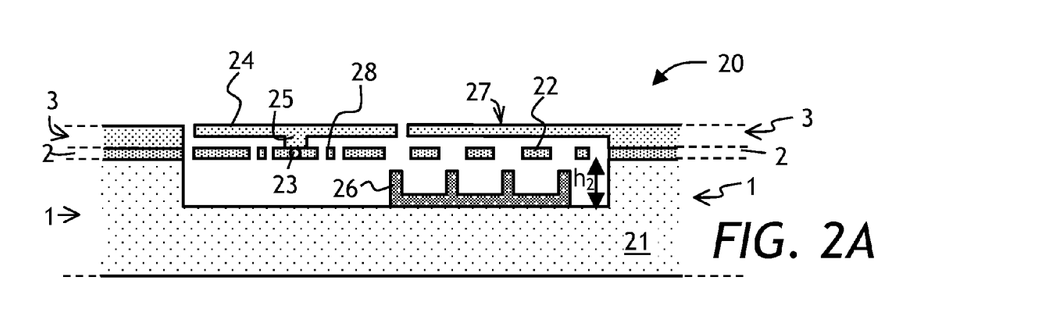
FIGS. 2A and 2B are side cross-sectional views of an asymmetric hidden-hinge uniaxial MEMS device of the present invention.
Figure 2B:
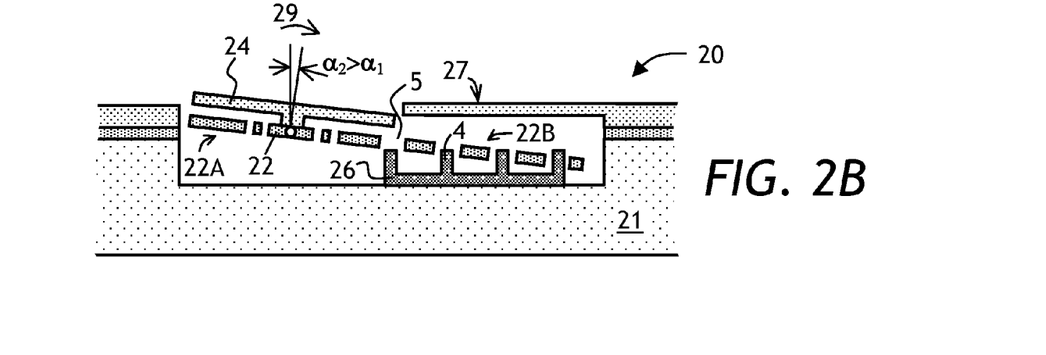

Referring to FIGS. 2A and 2B, a MEMS device 20 of the invention includes a substrate 21 and a pivoting structure tiltable about an axis 23 substantially parallel to the substrate 21, and suspended above the substrate 21 by a hinge 28. The pivoting structure includes a reflector (mirror) 24 fixed to a tiltable platform 22 by a pedestal 25. An electrode 26 (a stator electrode) is disposed on the substrate 21 below the outer free end of the tiltable platform 22 for pivoting the platform 22. One difference from the MEMS device 10 of FIGS. 1A, 1B is that the tiltable platform 22 of FIGS. 2A, 2B is asymmetric about the axis 23, having a long side 22B extending perpendicular to the axis 23 from under the reflector 24, and a short side 22A extending in an opposite direction. The short side 22A is substantially completely covered by the reflector 24 eliminating the chance of any stray light reflecting off of the short side 22A of the platform 22. The asymmetric platform 22 enables the overhang section over the short side 22A to be eliminated without risking problems with stray light and manufacturing yield issues, while having a remaining overhang section 27 disposed over the portion of the long side 22B of the tiltable platform 22 that extends from under the reflector 24. Accordingly, the tiltable platform 22 is only pivoted in a single direction shown by an arrow 29, and the overhang section 27 does not impede the tilting of the platform 22 in that direction. Preferably, only one electrode 26 is used for tilting the pivoting structure, with no electrodes disposed under the short side 22A of the tiltable platform 22.

The role of the overhang section 27 is twofold: first, it shields the long section 22B of the platform 22 from impinging light, thus reducing unwanted light scattering and reflections; and second, it increases manufacturing yield. The overhang section 27 protects a thin oxide membrane (not shown) underneath the mirror layer 3 for protection of the underlying platform layer 2 during micromachining of the mirror 24. The oxide membrane is etched away after release of the mirror 24. If the overhang section 27 were eliminated, the platform layer 2 would be exposed over an area several hundred microns long, which could cause the oxide membrane to crack and jeopardize the underlying silicon of the platform layer 2, reducing the manufacturing yield.

The pivoting structure, including the tiltable platform 22, the pedestal 25, and the reflector 24, is balanced about the axis 23 when the electrode 26 is turned off. In other words, the platform 22 has a center of gravity disposed on or directly above the axis 23. In the embodiment shown in FIGS. 2A and 2B, the tiltable platform 22 and the reflector 24 are balanced independently, that is, the platform 22 has a center of gravity on or directly above the axis 23, and the reflector 24 also has a center of gravity on or directly above the axis 23, with the pedestal 25 being disposed directly above the axis of tilt 23. In the embodiment shown, the pedestal 25 is disposed at a geometrical center of the reflector 22, for better optical quality of the reflector 24.

Ideally, the stator electrode 26 comprises a comb electrode including a plurality of comb fingers 4 extending upwardly from the substrate 21, and spaced apart beneath the outer free end of the long side 22A of the platform 22, as in FIGS. 2A and 2B, that is, spaced apart along a direction perpendicular to the axis 23 and parallel to the longitudinal axis of the platform 22. As will be shown below, the electrode orientation of the present invention enables the resulting transfer curve to be more linear. The long side 22B of the platform 22 includes a plurality of openings 5 superposed with the comb fingers 4 for interdigitating with the comb fingers 4 of the stator electrode 26. The openings 5 facilitate balancing the asymmetric platform 22 about the axis of tilt 23.

The hinge 28 includes a pair of torsional hinges defining the axis of tilt 23. The torsional hinges extend from opposite sides of the platform 22, being supported by a pair of posts, not shown in FIGS. 2A and 2B. The posts extend from the substrate 21 on the opposite sides of the platform 22 for receiving the ends of the torsional hinges.

Despite the unidirectional tilt of the platform 22, the overall tilting range is greater than that of the MEMS device 10 of FIG. 1. This is because a distance $h_2$ between the platform 22 and a bottom surface the substrate 21 of the MEMS device 20 of FIG. 2A can be made larger than twice the distance $h_1$ between the platform 12 and the overhang section 17 of the MEMS device 10 of FIG. 1A. Preferably, a substrate layer 1 is etched to a much larger depth than a relatively thin and delicate mirror layer 3 or a platform layer 2. For example, the distance $h_1$ is typically 20 micrometers, while the distance $h_2$ is typically 50 micrometers. Accordingly, the tilting angle $\alpha_2$ of the reflector 24 of the unidirectional MEMS device 20 of FIG. 2 is 25% bigger than twice the tilting angle $\alpha_1$ of the mirror 14 of the bidirectional MEMS device 10 of FIGS. 1A and 1B. This increased range of tilt is achieved with no electrodes mounted under the short side 22A of the tiltable platform 22.

Figure 3A:
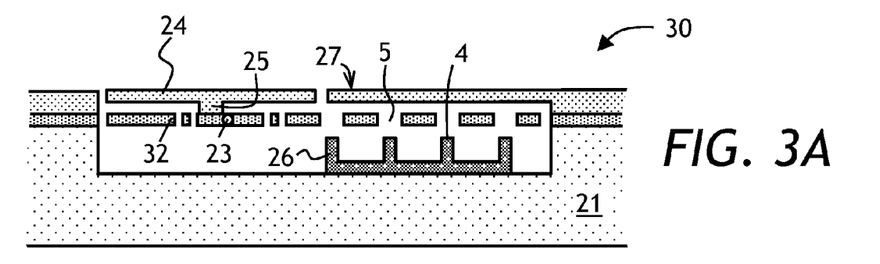
FIGS. 3A and 3B are side cross-sectional views of an asymmetric hidden-hinge uniaxial MEMS device having an offset mirror.
Figure 3B:
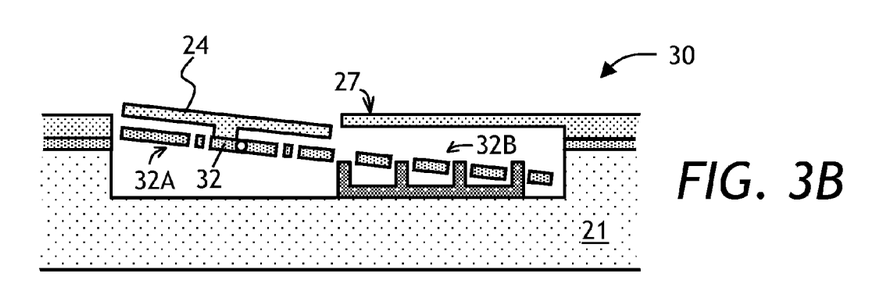

Turning to FIGS. 3A and 3B, a MEMS micromirror device 30 is similar to the MEMS micromirror device 20 of FIGS. 2A and 2B, the difference being that in the MEMS micromirror device 30 of FIGS. 3A and 3B, the mirror 24 is offset relative to the axis of tilt 23 to help balance the pivoting structure including a tiltable platform 32 having a short end 32A and a long end 32B, the pedestal 25, and the reflector 24. The mirror 24 is offset from above the axis 23 towards the short end 32A providing a counter weight to the long end 32A to ensure the center of gravity of the pivoting structure is along or directly above the axis 23.

Figure 4A:
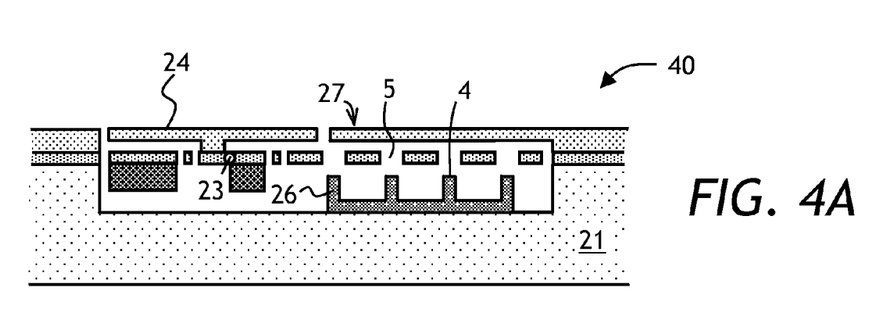
FIGS. 4A and 4B are side cross-sectional views of an asymmetric hidden-hinge uniaxial MEMS device having an offset mirror and a counterbalance weight.
Figure 4B:
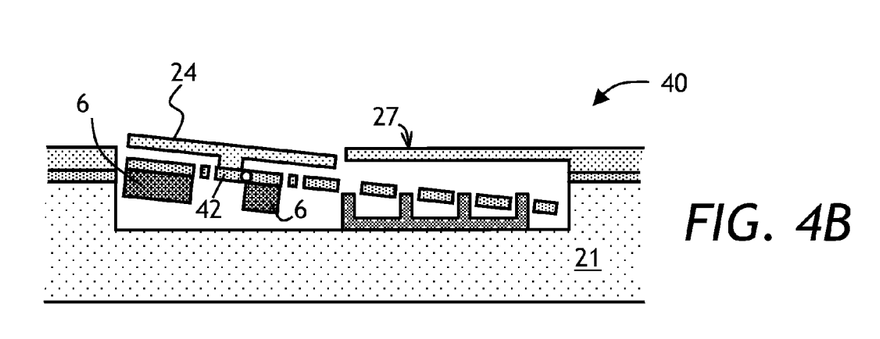

Referring now to FIGS. 4A and 4B, a MEMS micromirror device 40 is similar to the MEMS micromirror device 30 of FIGS. 3A and 3B, the difference being that in the MEMS micromirror device 40 of FIGS. 4A and 4B, a tiltable platform 42 includes a counterweight element 6 extending downwardly from the tiltable platform 42 to counter balance the extra weight of the long end of the platform 42 and to bring a center of gravity of the platform 42 down, so that the center of gravity of the pivoting structure is disposed substantially on the axis of tilt 23. This improves resistance of the MEMS micromirror device 40 to shock and vibration. The mirror 24 may or may not be offset from the axis 23, depending on the amount of counterbalancing weight required.

Figure 5A:
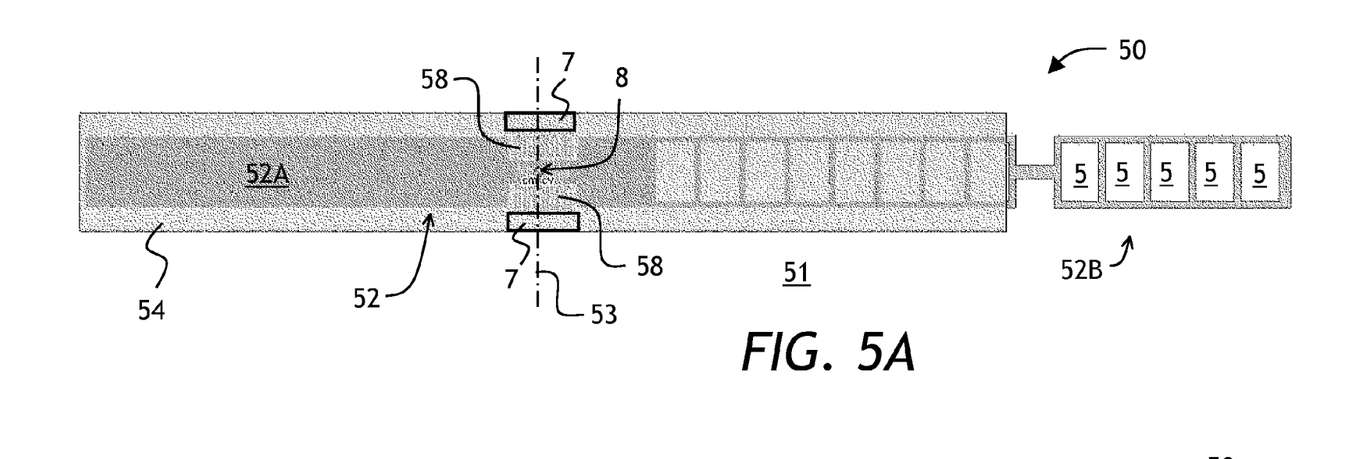
FIG. 5A is a plan view of a uniaxial MEMS device, showing relative proportions of elements according to one embodiment of the invention.
Figure 5B:
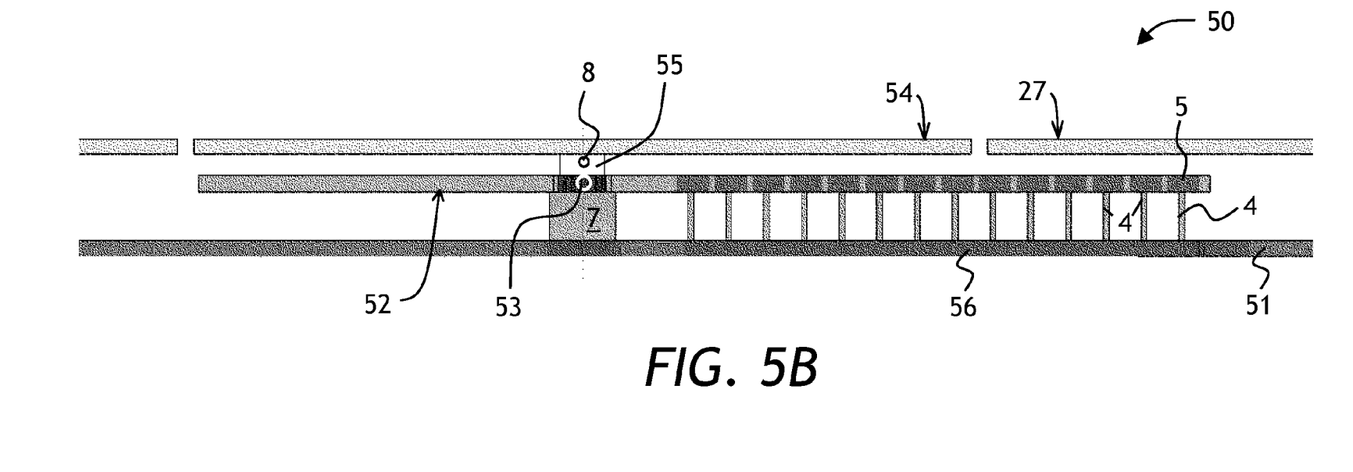
FIG. 5B is a side cross sectional view of the MEMS device of FIG. 5A, additionally showing an electrostatic stator comb actuator.

Turning to FIGS. 5A and 5B, a computer-aided-design (CAD) rendering of an actual MEMS device 50 is presented. The MEMS device 50 includes a tiltable platform 52 pivotable about an axis 53 substantially parallel to a substrate 51 in the plane of FIG. 5A. The tiltable platform 52 is asymmetric about the axis 53, having a short side 52A and a long side 52B. The long side 52B is formed with openings 5, while the short side is left solid, to mass balance the platform 52 about the axis of tilt 53. Conveniently, the openings 5 are disposed above the comb fingers 4 to interdigitate with the comb fingers 4 of a stator electrode 56, which extend upwardly from the substrate 51.

The MEMS device 50 further includes a mirror 54 formed with a pedestal 55 at the geometrical center of the mirror 54. A center of gravity 8 of the mirror 54 and the pedestal 55 is disposed directly above the axis of tilt 53. The pedestal 55 is mounted on the tiltable platform 52. A pair of torsional hinges 58 extends from opposite sides of the tiltable platform 52. A pair of posts 7 extend from the substrate 51 on the opposite sides of the tiltable platform to receive the ends of the torsional hinges 58. The overhang section 27 is disposed flush with the mirror 54 above the outer free end of the long side 52B of the platform 52.

Figure 6:
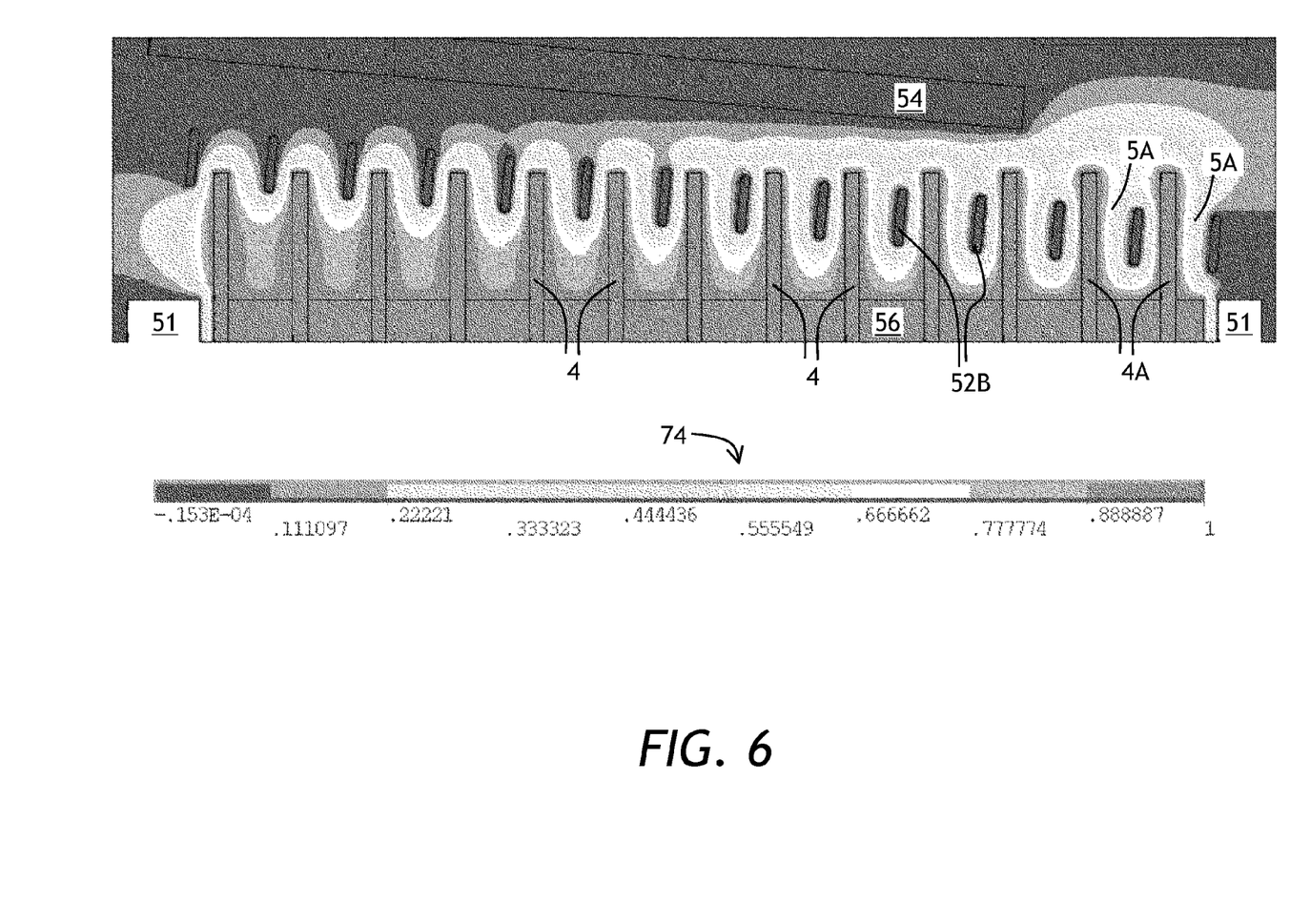
FIG. 6 is a cross-sectional view of a comb drive of the MEMS device of FIGS. 5A and 5B, showing a simulated electric field distribution in the comb drive.
Figure 7:
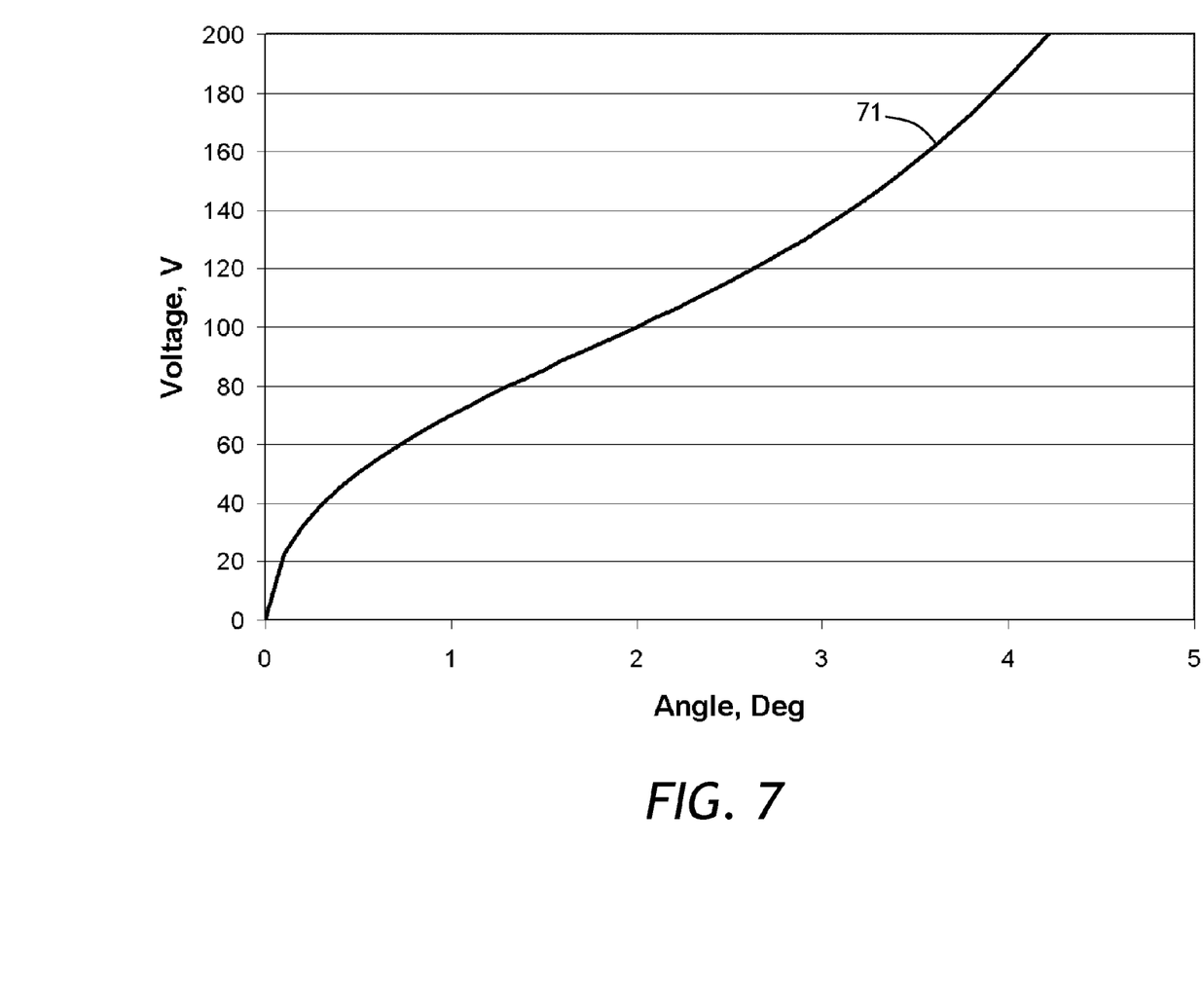
FIG. 7 is calculated transfer curve of the comb drive of FIG. 6.

Referring to FIG. 6, a simulated electric field distribution between the long platform side 52B and the fingers 4 of the stator comb electrode 56 is presented. The relative strength of the electric field, scaled between 1 and 0, is represented by a shades bar 74. The purpose of the simulation is to obtain a transfer curve establishing a relationship between the angle of tilt of the pivoting structure, i.e. the mirror 54, and the applied voltage. Turning to FIG. 7, a transfer curve 71 is quasi linear for angles of tilt between 0.5 and 4 degrees. An angle of over 4 degrees is obtained when comb fingers 4A extend completely through corresponding openings 5A in the tiltable platform 52. At this angle, top portions of the fingers 4A start to attract the tiltable platform 52, which prevents the transfer curve 71 from having an abrupt upward slope. Advantageously, this prevents snapping of the platform 52 to the stator comb electrode 56 and makes the transfer curve 71 more linear across most of the working range.

Figure 8A:
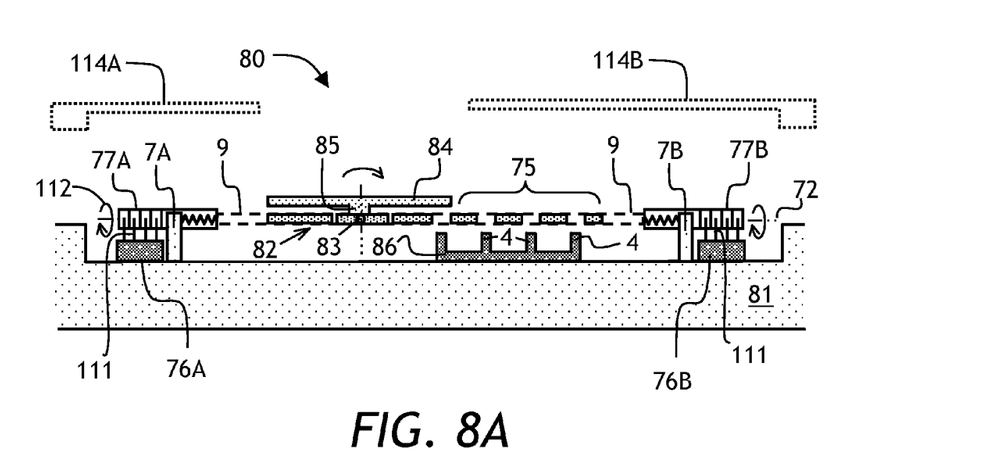
FIGS. 8A and 8B are side cross-sectional and plan views of a biaxial MEMS device of the invention.
Figure 8B:
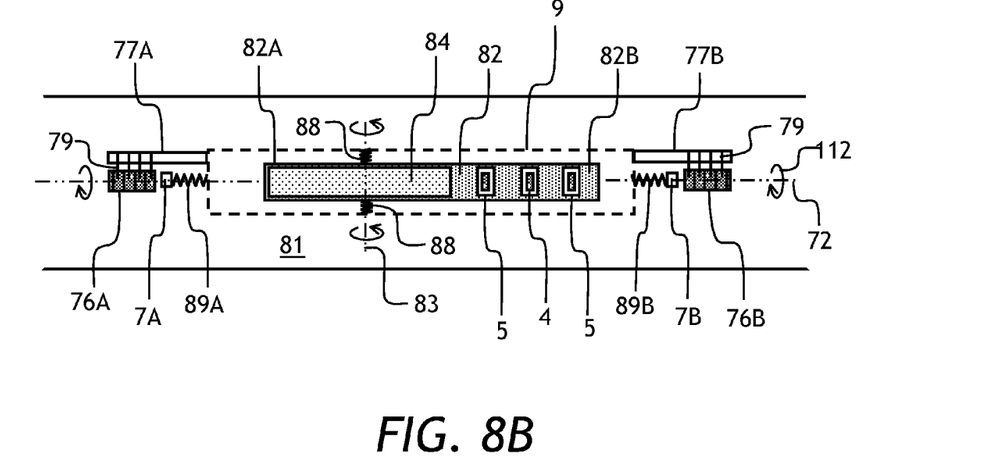

Turning now to FIGS. 8A and 8B, a MEMS device 80 is tiltable about mutually orthogonal first and second axes 83 and 72, respectively. The MEMS device 80 includes a tiltable platform 82 mounted over a substrate 81 and pivotable about the first axis 83 substantially parallel to the substrate 86. The tiltable platform 82 is asymmetric, that is, it has a long side 82B extending perpendicular to the first axis 83, and a short side 82A extending in an opposite direction. A reflector 84 has a pedestal 85 mounted on the tiltable platform 82. A center of gravity of the pivoting structure formed by the tiltable platform 82 and the reflector 84 is disposed directly above the first axis 83 and/or the second axis 72. The platform 82 is preferably balanced about the first and/or the second axis 72, the reflector 84 being independently balanced about the first axis 83 and/or the second axis 72, respectively. For embodiments where the reflector 84 is balanced about both axes 83 and 72, it is preferable that the pedestal 85 is disposed on or directly above both axes 83 and 72. It is also preferable that the pedestal 85 extends from the reflector 84 at the reflector's geometrical center, for better optical quality of the reflector 84. The reflector 84 is shown in FIGS. 8A and 8B as a flat mirror, although non-flat mirrors and other reflecting structures can be used.

A fraction 75 of the long side 82B of the tiltable platform 82 extends from under the mirror 84. The long side 82B of the tiltable platform 82 has a plurality of the openings 5, which form first rotor electrode fingers for interdigitating the comb fingers 4 of a first stator electrode 86.

Described next are the features enabling the biaxial tilt of the MEMS device 80. First torsional hinges 88 extending from opposite sides of the tiltable platform 82 are received not by a pair of stationary posts as in the uniaxial MEMS device 50, but instead by a gimbal 9 shown in dashed lines, pivotable about the second axis 72. The gimbal 9 surrounds the tiltable platform 82, as best seen in FIG. 8B. Second torsional hinges 89A, 89B, defining the second axis 72, extend from opposite sides of the gimbal 9. A pair of posts 7A, 7B extend from a substrate 81 on the opposite sides of the gimbal 9 and receive the ends of the second torsional hinges 89A, 89B. Thus, the platform 82 and the mirror 84 are tiltable, as a unit, about the mutually orthogonal axes 83 and 72. Second rotor electrodes 77A, 77B extend from opposite ends of the gimbal 9. Fingers 79 of the second rotor electrodes 77A, 77B are superposed for interdigitating with corresponding fingers 111 of second stator electrodes 76A, 76B. In operation, the second rotor electrodes 77A, 77B are electrostatically attracted to the second stator electrodes 76A, 76B, respectively, causing a unidirectional tilt of the gimbal 9 about the second axis 72 as indicated by an arrow 112. The platform 82 and the mirror 84 tilt about the second axis 72 together with the gimbal 9.

Counterweight elements, not shown, similar to the counterweight elements 6 of the MEMS device 40 of FIG. 4, can be used to bring the center of gravity to be on the first axis 83 and/or on the second axis 72. Support areas, not shown, on the substrate 86 can be used in place of the posts 7A, 7B, in which case the electrode structures are disposed within a cavity, not shown, etched in the substrate 81 between the support areas. Optional overhang sections 114A, B are preferably disposed over the uncovered portion 75 of the tiltable platform 82 and of the gimbal 9, for protecting the tiltable platform 82 and the gimbal 9 from impinging light. The overhang sections 114A, B are shown in FIG. 8A in dotted lines, being raised in FIG. 8A to show underlying structures.

Figure 9A:
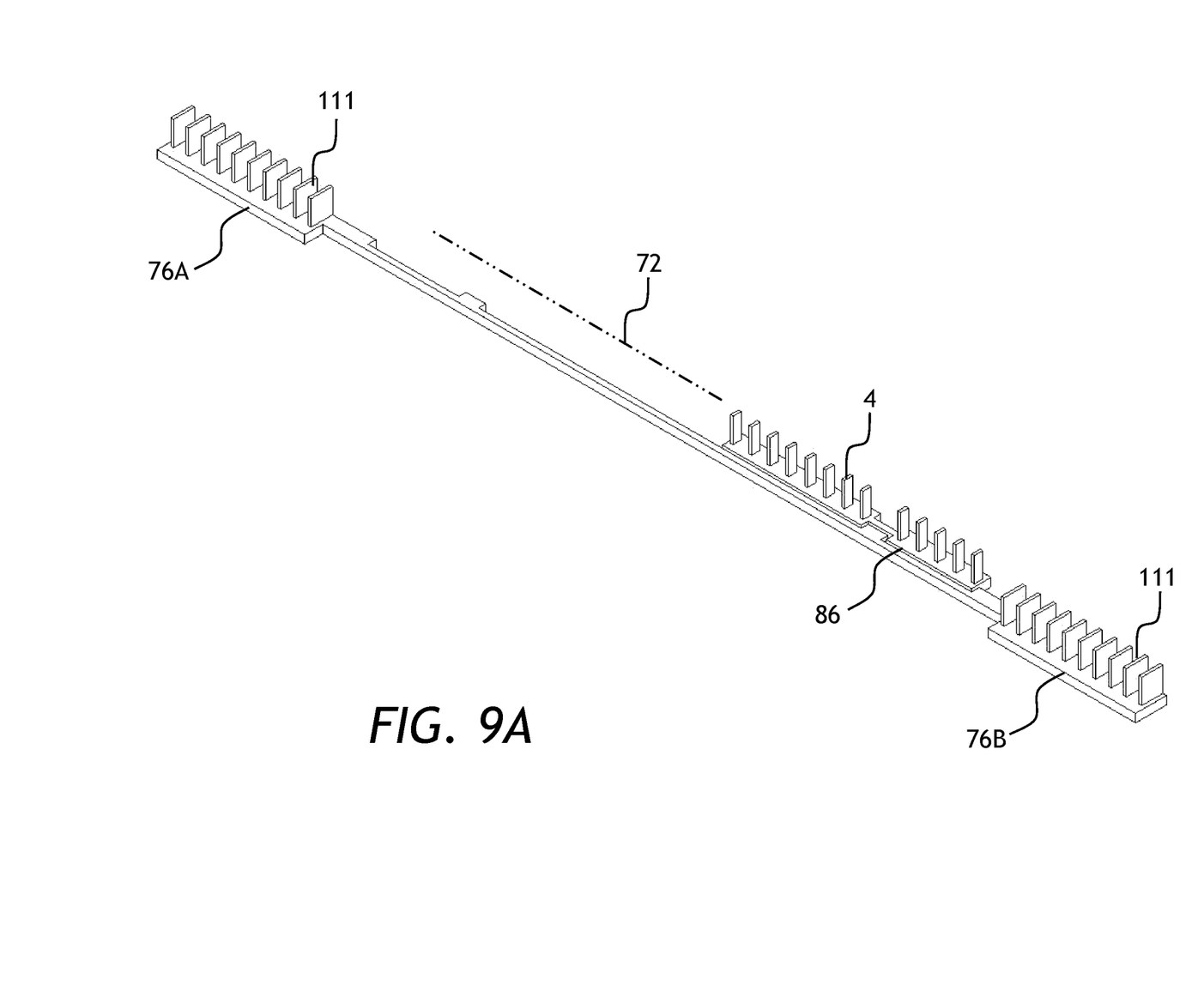
FIGS. 9A to 9C are isometric views of a stator electrode structure; the electrode structure with the platform and gimbal; and the full structure, respectively, of the biaxial MEMS device of FIGS. 8A and 8B.
Figure 9B:
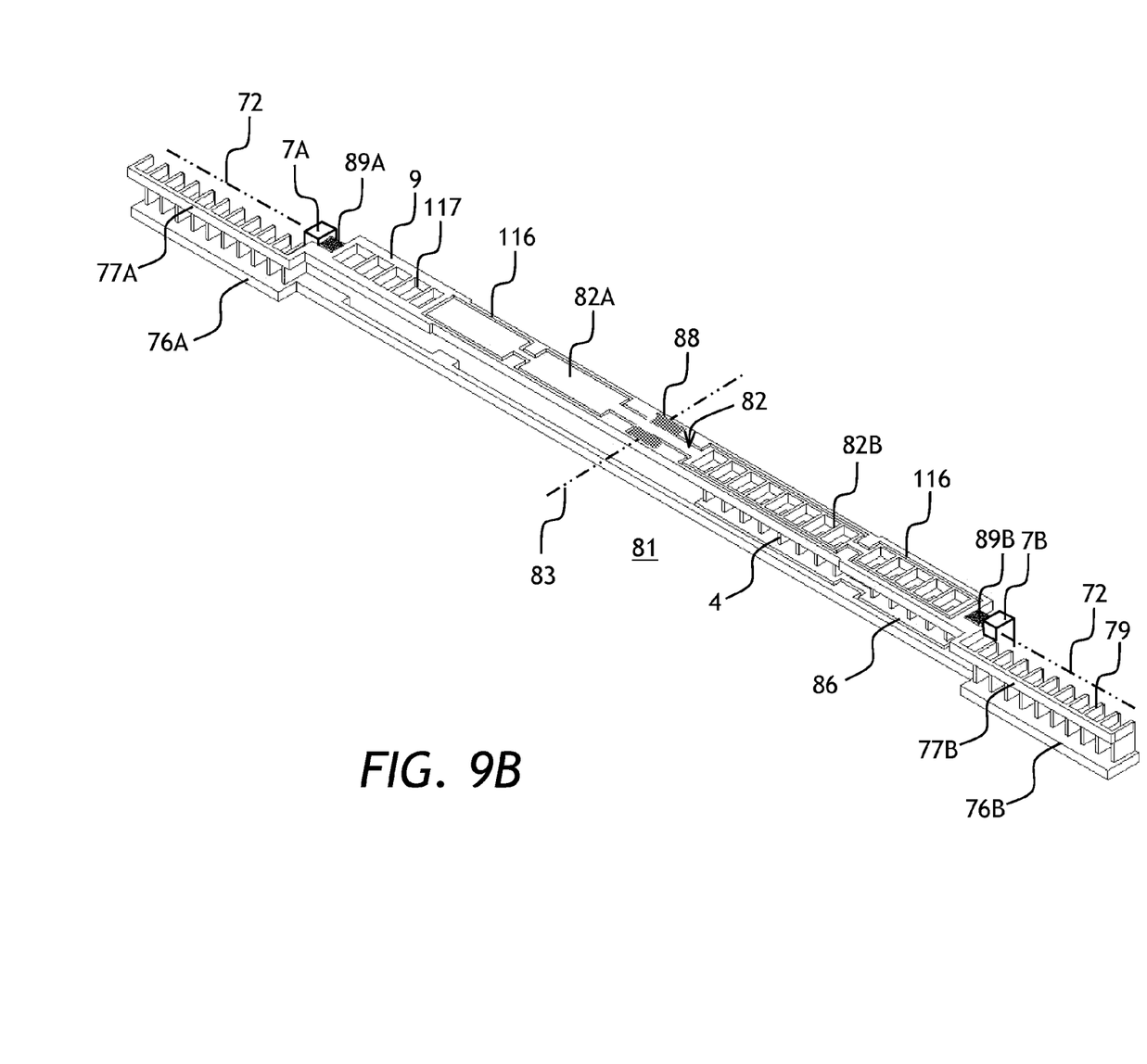
Figure 9C:
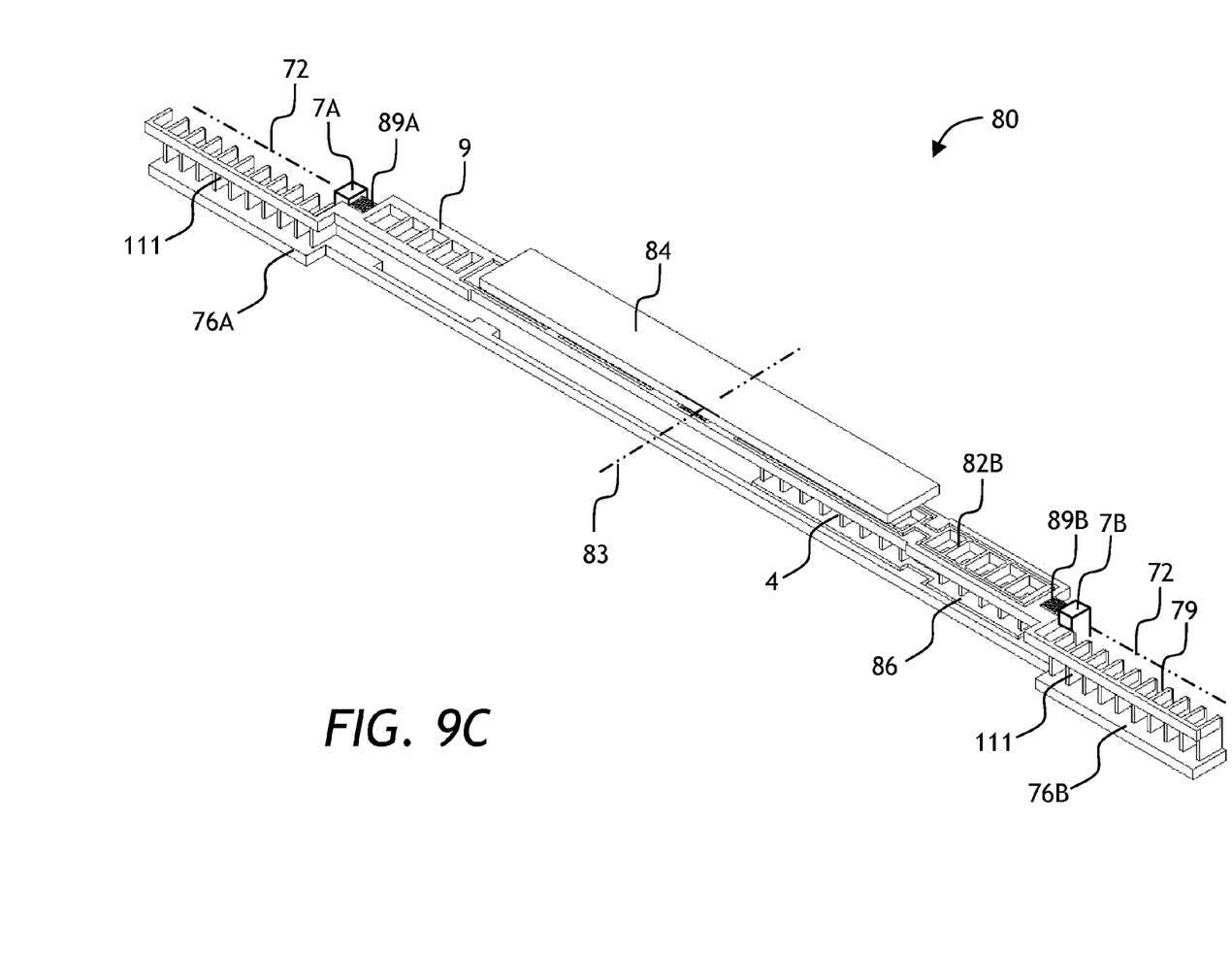

Turning to FIGS. 9A to 9C, the biaxial MEMS device 80 is shown in three separate isometric views, starting from the stator electrodes 76A, 76B, and 86 (FIG. 9A), the platform 82 and the gimbal 9 over the electrodes 76A, 76B, and 86 (FIG. 9B), and the assembled MEMS device 80 (FIG. 9C). The stator electrodes 76A, 76B, and 86 have the fingers 111 and 4 disposed along a same axis, that is, the second axis 72. In FIG. 9B, the gimbal 9 receiving the ends of the first hinges 88 surrounds the tiltable platform 82 leaving only a narrow gap 116 therebetween. The gimbal 9 may have openings 117 for balancing the gimbal 9. The second rotor electrodes 77A, 77B are disposed to one side form the second axis 72, for unidirectional rotation of the gimbal 9 and the platform 82 about the second axis 72. The gimbal 9 is supported by the second torsional hinges 89A, 89B, received by the posts 7A and 7B, respectively, extending from the substrate 81. In FIG. 9C, the reflector 84 is disposed on a pedestal, not seen in FIG. 9C, extending from the platform 82.

Figure 9D:
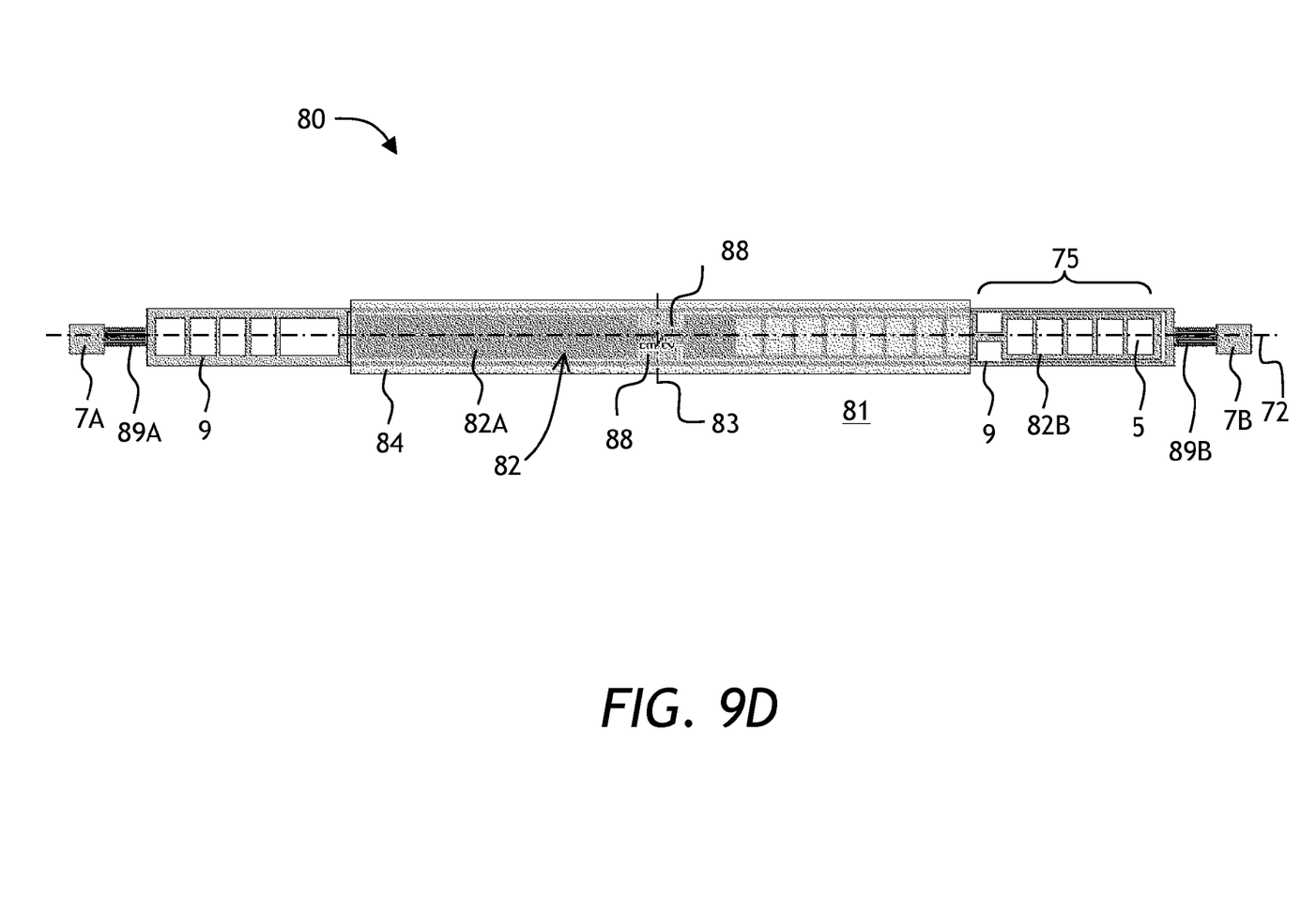
FIG. 9D is a plan view of the pivotable part of the biaxial MEMS device of FIGS. 9A to 9C.

Turning now to FIG. 9D, the gimbal 9, the platform 82, and the mirror 84 are shown in a top view. The reflector 84 extends over the short side 82A and a first portion of the long side 82B of the tiltable platform 82, the second portion 75 of the long side 82B of the tiltable platform 82 extending from under the reflector 84.

The above disclosed MEMS devices 20, 30, 40, 50, and 80 can have non-torsional hinges, for example rotary hinges, although torsional hinges are preferable. Planar electrostatic actuators including a pair of flat electrodes can be used in place of comb actuators shown in FIGS. 2A, 2B to 9A-9D. Concave or convex mirrors, dielectric coatings, etc., or any other suitable lightweight reflectors can be used in place of and/or in addition to the elongate flat mirrors 24, 54, 84, and 94 of FIGS. 2A, 2B to 5A, 5B, 6, 8, and 9.

Figure 10:
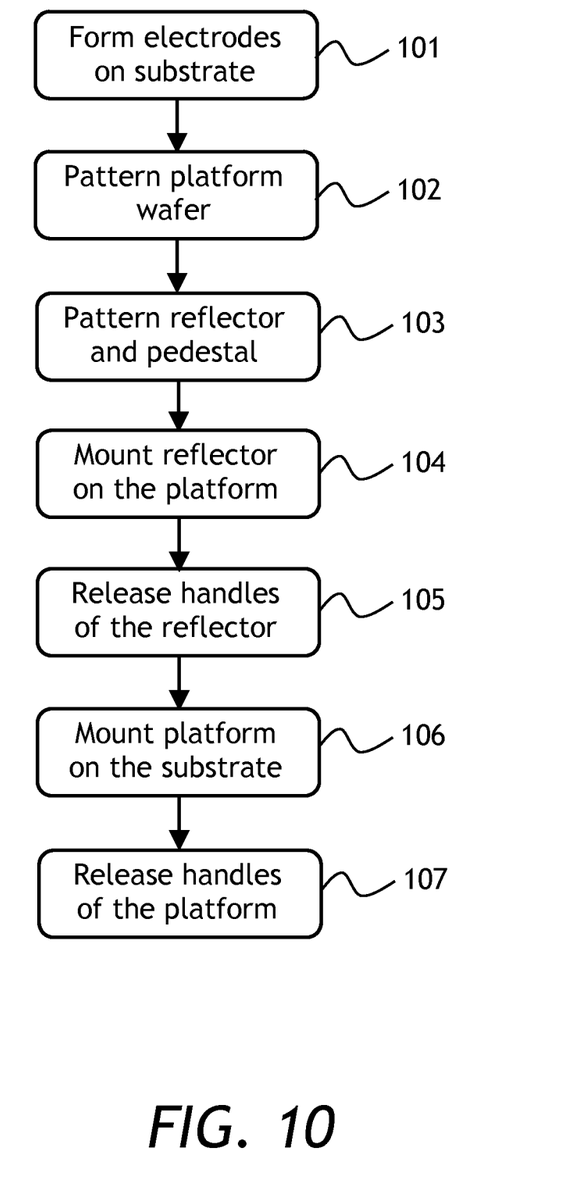
FIG. 10 is a block diagram of a method of manufacturing of MEMS devices of the invention.

Turning now to FIG. 10, a typical process of manufacturing the above described MEMS devices 20, 30, 40, and 50 can include the following steps.

At a step 101, a substrate, for example the substrate 21 of FIG. 2, is provided having the electrode 26 mounted thereon.

At a step 102, a platform wafer, including the platform layer 2 of FIG. 2A, is provided. The platform wafer is processed (patterned) to include: the tiltable platform 26 pivotable about the tilt axis 23; a first support for supporting the tiltable platform 23 over the substrate 21; and the hinge 28.

At a step 103, a mirror wafer, including the mirror layer 3 of FIG. 2A, is provided including the reflector 24 and the pedestal 25.

At a step 104, the mirror wafer is mounted on the platform wafer, so as to mount the pedestal 25 on the tiltable platform 22, so that a pivoting structure comprising the reflector (mirror) 24, the pedestal 25, and the tiltable platform 22 has a center of gravity on or directly above axis of tilt 23.

At a step 105, handles of the reflector wafer are removed or released, so that the reflector 24 is supported only by the pedestal 25.

At a step 106, the platform wafer is mounted on the substrate 21, so as to dispose the electrode 26 under the long side 22B of the tiltable platform 22, and to connect the hinge support to the substrate 21.

Finally, at a step 107, handles of the platform wafer are removed or released, so that the tiltable platform 22 is suspended on the hinges 28.

The biaxial MEMS device 80 of FIGS. 8A, 8B, and 9A to 9D can be manufactured by a similar process, in which, at the step 102, the platform wafer would also include the gimbal 9 and the second hinge structures 89A and 89B.

What is claimed is:
1. A micro-electro-mechanical device comprising:
   a substrate;
   a pivoting structure comprising:
      a tiltable platform disposed over the substrate, pivotable about a first axis substantially parallel to the substrate, wherein the tiltable platform is asymmetric about the first axis, having a long side extending in a first direction perpendicular to the first axis and a short side extending a shorter distance than the long side in a second, opposite direction;
      a pedestal extending upwardly from the tiltable platform; and
      a reflector mounted on the pedestal, the reflector extending over the short side and a first portion of the long side of the tiltable platform, wherein a second portion of the long side of the tiltable platform extends from under the reflector;

wherein the pivoting structure has a center of gravity on or directly above the first axis;

a first support for supporting the tiltable platform over the substrate;

a first hinge structure defining the first axis, extending between the first support and the tiltable platform; and a first electrode structure including a first electrode mounted on the substrate under the long side of the tiltable platform, for tilting the pivoting structure about the first axis.

2. The micro-electro-mechanical device of claim 1, wherein the first hinge structure comprises a pair of torsional hinges extending from opposite sides of the tiltable platform, and wherein the first support comprises a pair of posts extending from the substrate on the opposite sides of the tiltable platform and receiving the ends of the torsional hinges.

3. The micro-electro-mechanical device of claim 1, further comprising a covering structure mounted on the substrate proximate to the long side of the tiltable platform, the covering structure having an overhang section disposed over the second portion of the long side of the tiltable platform.

4. The micro-electro-mechanical device of claim 1, wherein the reflector has a center of gravity on or directly above the first axis, and the tiltable platform has a center of gravity on or directly above the first axis.

5. The micro-electro-mechanical device of claim 4, wherein the pedestal is disposed on or directly above the first axis.

6. The micro-electro-mechanical device of claim 1, wherein the pedestal extends from the reflector at the reflector's geometrical center.

7. The micro-electro-mechanical device of claim 1, wherein the tiltable platform includes a counterweight element extending downwardly therefrom, so that a center of gravity of the pivoting structure is disposed substantially on the first axis.

8. The micro-electro-mechanical device of claim 1, wherein the first electrode structure includes only the first electrode, whereby the micro-electro-mechanical device is absent an electrode mounted under the short side of the tiltable platform.

9. The micro-electro-mechanical device of claim 8, wherein the first electrode comprises a comb electrode including a plurality of comb fingers spaced apart along a direction perpendicular to the first axis, wherein the long side of the tiltable platform comprises a plurality of openings for interdigitating with the comb fingers of the first electrode.

10. The micro-electro-mechanical device of claim 9, wherein the platform is tiltable during use through an angular range, so that at least some of the comb fingers extend completely through the corresponding openings in the tiltable platform.

11. The micro-electro-mechanical device of claim 1, wherein the reflector is an elongate flat mirror.

12. The micro-electro-mechanical device of claim 1, wherein the first hinge structure comprises first torsional hinges extending from opposite sides of the tiltable platform, wherein the first support comprises a gimbal for pivoting about a second axis perpendicular to the first axis, surrounding the tiltable platform and receiving the ends of the first torsional hinges, the micro-electro-mechanical device further comprising:

second torsional hinges defining the second axis, extending from opposite sides of the gimbal;

a pair of second supports on the substrate on the opposite sides of the gimbal and receiving the ends of the second torsional hinges; and a second electrode mounted on the substrate, for pivoting the gimbal, the tiltable platform, and the reflector about the second axis.

13. The micro-electro-mechanical device of claim 12, wherein the pivoting structure has a center of gravity on or directly above the second axis.

14. The micro-electro-mechanical device of claim 12, further comprising a covering structure mounted on the substrate proximate to the long side of the tiltable platform, the covering structure having an overhang section disposed over the second portion of the long side of the tiltable platform extending from under the reflector.

15. The micro-electro-mechanical device of claim 12, wherein the pedestal is disposed on or directly above the first and the second axes of tilt.

16. The micro-electro-mechanical device of claim 15, wherein the tiltable platform includes a counterweight element extending downwardly therefrom, so that a center of gravity of the pivoting structure is disposed substantially on the first and the second axes of tilt.

17. The micro-electro-mechanical device of claim 12, wherein the first electrode is a comb electrode having a plurality of comb fingers spaced apart along the second axis, wherein the long side of the tiltable platform comprises a plurality of openings for interdigitating with the comb fingers of the first electrode.

18. The micro-electro-mechanical device of claim 17, wherein the second electrode is a comb stator electrode, wherein the gimbal comprises a comb rotor electrode interdigitated with the comb stator electrode.

19. The micro-electro-mechanical device of claim 18, wherein the comb stator electrode comprises a plurality of comb fingers spaced apart along the second axis.

20. The micro-electro-mechanical device of claim 12, wherein the reflector is an elongate flat mirror.

* * * * *